United States Patent [19]

Thornburg et al.

[11] 4,126,824

[45] Nov. 21, 1978

[54] PROGRESSIVELY SHORTED TAPERED RESISTANCE DEVICE

[75] Inventors: David D. Thornburg, Los Altos, Calif.; Roy J. Lahr, Fairfield, Conn.

[73] Assignee: Xerox Corporation, Stamford, Conn.

[21] Appl. No.: 789,392

[22] Filed: Apr. 21, 1977

[51] Int. Cl.[2] .......... G01R 27/02

[52] U.S. Cl. .......... 324/62; 324/96; 324/106; 338/25; 338/217; 338/314

[58] Field of Search .......... 324/96, 62, 106; 73/356; 350/160 LC; 338/25, 217, 314

[56] References Cited

U.S. PATENT DOCUMENTS

| | | | |
|---|---|---|---|
| 2,755,457 | 7/1956 | Diemer et al. | 324/96 UX |
| 3,149,281 | 9/1964 | Lieb | 324/96 |
| 3,244,979 | 4/1966 | Hershinger | 324/96 |
| 3,524,726 | 8/1970 | Koster | 324/96 UX |
| 4,006,414 | 2/1977 | Parker | 324/96 X |

FOREIGN PATENT DOCUMENTS

| | | | |
|---|---|---|---|
| 1,318,007 | 5/1973 | United Kingdom | 324/96 |

OTHER PUBLICATIONS

Schwartz et al., Indicator, IBM Technical Disclosure Bulletin, Aug. 1960, pp. 63 & 64.

*Primary Examiner*—Stanley T. Krawczewicz
*Attorney, Agent, or Firm*—Leonard Zalman; W. Douglas Carothers, Jr.

[57] ABSTRACT

A progressively shorted tapered resistance device including a body of material which undergoes an irreversible resistance decrease when heated beyond a threshold temperature in operative association with a tapered electrical resistance element which develops a non-uniform temperature profile when electrically energized. Upon sufficient energization, the tapered resistor element will cause portions of the heat sensitive material to be heated beyond its threshold temperature resulting in a shorting out of a portion of the tapered resistance element. The amount of the tapered resistance element shorted out is measured at low currents to provide an indication of the energizing current.

15 Claims, 6 Drawing Figures

PROGRESSIVELY SHORTED TAPERED RESISTANCE DEVICE

BACKGROUND OF THE INVENTION

A device for displaying and recording analog information is described in copending U.S. patent application Ser. No. 747,167 entitled "Tapered Resistor Device" now abandoned. In that device the non-uniform temperature profile produced by a tapered electrically resistive element, when it is electrically energized, interacts with a threshold-type thermally sensitive medium, for example, a liquid crystal. The interaction results in the creation of a visible strip or dot along or in the threshold-type thermally sensitive medium, with the length or position of the strip or dot related in a straightforward fashion to the magnitude of the current flowing through the tapered electrically resistive element, whereby the device displays or records information.

The tapered electrically resistive element of the device described is comprised of a tapered resistive film which has a constant resistivity over the temperature range of interest. For a gradual taper, the local temperature rise of the resistive metal film above ambient, T, is given by $$T = \frac{A\,I^2\,P_s}{w^2}$$

in which $A$ is a constant, $I$ is the current flowing in the tapered resistive film, $P_s$ is the sheet resistivity of the tapered resistive film, and $W$ is the taper width at the point of interest along the resistive film. Suppose a given resistive film has a 3:1 taper ($W_{maximum}/W_{minimum} = 3$); then, if the midpoint temperature rise to $T_0$, the temperature rise at the narrow end of the resistive film is $4T_0$ and that at the wide end of the resistive film is $4T_0/9$. If $T_0$ represents the threshold temperature rise needed to create the desired thermographic indication in the threshold-type thermally sensitive medium, then any regions of the resistive film heated above $T_0$ results in unnecessary power dissipation.

OBJECTS OF THE INVENTION

An object of the present invention is to provide a tapered resistor device having reduced power dissipation.

A further object of the present invention is to provide a tapered resistor device with means to limit power dissipation in regions which have been heated above a threshold temperature.

A still further object of the present invention is to provide a tapered resistance device having at least portions which undergo a permanent resistance change when heated above a threshold temperature.

Another object of the present invention is to provide a tapered resistance device which provides a permanent indication of the extent to which the tapered resistor element thereof has been heated above a threshold temperature.

SUMMARY OF THE INVENTION

In accordance with the invention a body of heat-sensitive material which undergoes an irreversible resistance decrease when heated to a threshold temperature above ambient is provided in operative association with a tapered electrically resistive element which develops a non-uniform temperature profile when electrically energized. Upon sufficient electrical energization at least a portion of the tapered resistive element will be heated beyond the referenced threshold temperature of the heat-sensitive material and, due to the operative association of the tapered resistance element and the heat-sensitive material, a portion of the heat-sensitive material will also be heated beyond the referenced threshold temperature. The portion of the heat-sensitive material heated beyond the threshold temperature will exhibit a marked resistance decrease, becoming in effect a good or better electrical conductor and "shorting out" the portion of the tapered resistor element adjacent to it. By measuring the resistance of the tapered resistor element at low currents, the amount of the taper which has been "shorted out" can be measured electrically. Upon re-biasing a partially shorted tapered resistor, currents in excess of the maximum current previously impressed on the tapered resistor element will cause additional portions of the heat sensitive material to be heated to the threshold temperature at which a marked resistance decrease is effected. This progressive shorting allows taper usage to be stored in an analog fashion which can be readily measured electronically at low bias levels.

DETAILED DESCRIPTION OF THE INVENTION

Figure 1:
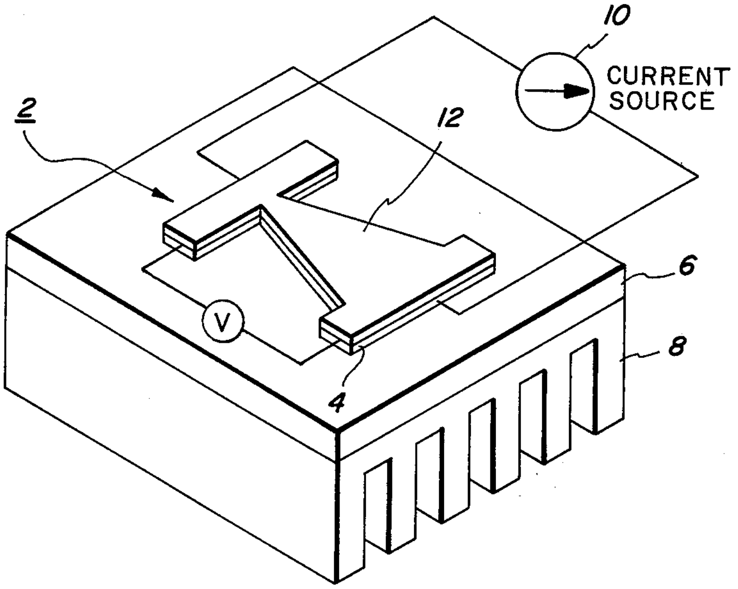
FIG. 1 is a schematic representation of one form of progressively shorted tapered resistance device in accordance with the invention.

Referring now to FIG. 1, a tapered resistance device 2 in accordance with one aspect of the invention is shown as including an electrically resistive film 4 which has a uniform thickness and a varying width in the horizontal plane. Film 4 is supported by an insulating substrate 6 which in turn is bonded to a heat sink 8.

As clearly shown in FIG. 1, the width of resistive film 4 is a monotonically increasing function of position along the length of the film, or in simple terms, the resistive film is tapered. When tapered resistive film 4 is electrically energized, as by connecting a source 10 across it, as shown, the amount of the tapered resistor film heated above a given threshold temperature will depend upon the magnitude of the current flowing through the tapered resistive film 4. It is noted that the relationship between the length of the tapered resistive film heated above the threshold temperature follows the same functional dependence on the current flow through the film 4 as does the slope of the film. For example, a linear taper yields a linear current response and a logarithmic taper yields a logarithmic response.

Thus far, the resistive film 4 has been described wherein the taper varies in width. However, the device 2 will also function if the resistive film 4 is tapered, in addition to width, in thickness, bulk resistivity, or permutations or combinations of the foregoing. Further explanation of the functions of the tapered resistive film are contained in U.S. patent application Ser. No. 747,167, which is incorporated herein by reference.

A layer 12 of heat sensitive material is deposited on the film 4. As shown, the layer 12 conforms to the boundaries of the film 4, however, satisfactory operation can be achieved by a strip of the heat sensitive material centered along the length of the tapered resistive film or by a layer of heat sensitive material that extends beyond the boundaries of the film 4. Referring more particularly to layer 12, the material thereof has the property of undergoing an irreversible electrical resistance decrease when heated to a temperature $T_0$ above ambient. That is, as each elemental portion of the layer 12 is heated to a temperature of $T_0$ above ambient, that portion of the layer 12 exhibits an irreversible decrease in electrical resistance. Since, as noted, the amount of the tapered resistive film 4 heated above $T_0$ changes as the magnitude of the current supplied thereto changes, the resistive film 4 provides a means for irreversibly changing (decreasing) the resistance of elemental portions of the layer 12.

In operation, under bias from source 10, the tapered resistive film will have some portion thereof heated above $T_0$ above ambient. The heated portion of the tapered resistive film will cause a portion of the layer 12 to be heated to the temperature of $T_0$ above ambient. That portion of the layer 12 heated to $T_0$ above ambient will experience an irreversible decrease in electrical resistance which decrease is effective to "short out" the portion of the tapered resistive film 4 in contact therewith. Thus, the tapered resistive film 4 will have a decreasing resistance value depending upon the magnitude of the current flowing therethrough. By measuring the resistance of film 4 at low currents, the amount of the tapered resistor that has been shorted, that is, the amount of the tapered resistor film heated to a temperature sufficient to cause the contacting portion of layer 12 to switch to its low resistance value, can be measured electrically. Thus, the maximum current passing through the tapered resistive film 4 can be measured. Upon rebiasing a partially shorted device 2, an additional portion of the material of layer 12 will undergo a resistant change when the applied current is in excess of the maximum current previously impressed on the film 4. The resistance change across film 4 with variation in the magnitude of the current therethrough allows current flow or device usage to be stored in an analog fashion which can be measured readily at low bias levels.

Any suitable electrically resistive material may be employed in the tapered resistor element 4 of the instant invention. Typical electrically resistive materials include chromium, nichrome and nickel thin films as well as laminated foils of nichrome, monel, Inconel or stainless steel. In addition, numerous resistive paints and inks may be employed including acrylic-based paints which have been silver-filled to provide some electrical conductivity. The materials described above typically exhibit sheet resistivity in a range of from 0.1 to 1,000 ohms/square inch. Generally, the choice of sheet resistivity for the tapered resistor device is governed by geometry and final device application.

The resistive materials described may be formed into films employing any suitable technique. Three particularly suitable techniques include vapor deposition of thin metallic films, lamination of thin metallic foils, and rotogravure and offset printing of electrically resistive printing inks onto a suitable substrate. The tapered resistor pattern is formed in the first two methods by conventional photolithographic processing techniques, whereas with printed resistors the ink is transferred in the proper pattern directly from a master roller to the substrate.

Any material that exhibits a marked, irreversible decrease in electrical resistance when heated beyond a threshold temperature can be utilized as the material of layer 12. Examples of such materials include chalcogenide glass films which behave as intrinsic semiconductors (high resistance) in their glassy state but which behave as degenerately doped semiconductors in their crystalline state. The transition of the chalcogenide glasses from the amorphous state to the crystalline state is induced by heating the material beyond ambient temperature by some designated temperature (above $T_0$ above ambient in the device described). Other suitable materials for layer 12 include glasses from the system Ge-Te, with glasses of composition $Ge_{15}Te_{85}$ being suitable. Also, glasses from the As-Se-Te system can be used with $As_2SeTe_2$, $As_2Se_2Te$ and $As_4Se_3Te_3$ being suitable examples from this system. Non-chalcogenide glasses such as certain glasses from the Cd-As system can also be used, as can numerous other solid materials which undergo irreversible reductions in electrical resistance on heating.

The heat sensitive material 12 described may be deposited on the film 4 by various techniques. One of those techniques is flash evaporation of a thin film in a high vacuum chamber. Other deposition techniques, including sputtering, may be employed. Alternatively, powder of the appropriate glass can be mixed in a binder and deposited over the tapered resistance element by silk screening or some other appropriate, conventional process.

It is preferred that the sheet resistivity of the tapered resistor material be the geometric mean of the sheet resistivity of the material of layer 12 in its high and low resistance states. It is also preferred that the material of layer 12 have a melting point in excess of the highest taper temperature in the absence of layer 12.

Figure 2:
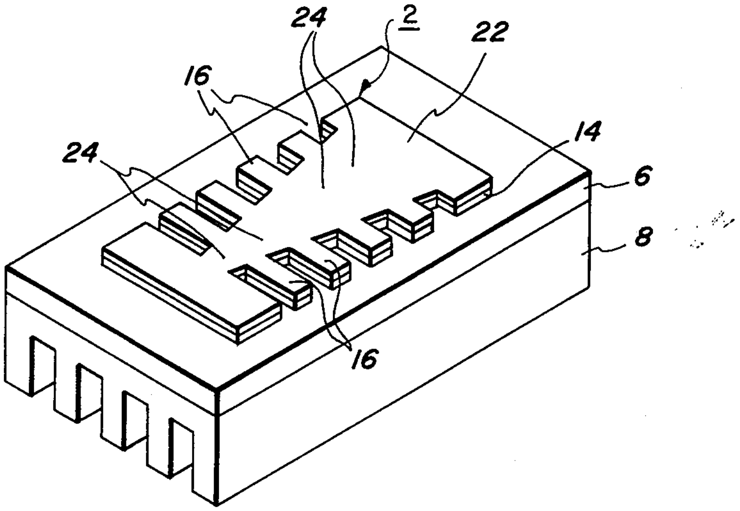
FIG. 2 is a schematic representation of another form of the progressively shorted tapered resistance device of the invention.

In the device of FIG. 1, the taper of film 4 is smooth, that is, linear, exponential, paraboloidal, etc. FIG. 2 depicts a device of the type of FIG. 1 in which the resistive film has a stepped configuration, that is, the resistive film 14 has tabs 16 along its length. The function of tabs 16 is to provide wide regions along the length of the tapered resistive film. The wide regions act as local areas of good electrical conductivity so that power dissipated when a current is applied to the film 14 will be restricted primarily to the tapered segments 24 between tabs 16. This feature allows only the tapered segments 24 to be heated beyond a threshold value whereby a non-continuous current flow indication is provided. As in the device of FIG. 1, a layer 22 of material which exhibits an irreversible decrease in electrical resistance when heated beyond a threshold temperature is deposited on resistive film 14. Further details of the operation of the segmented tapered resistor element of FIG. 2 are disclosed in U.S. patent application Ser. No. 747,149, which is incorporated herein by reference.

Figure 3:
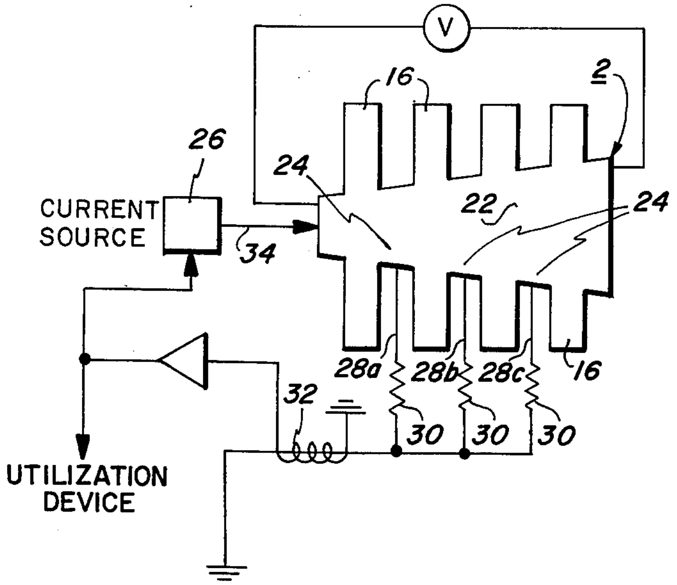
FIGS. 3 and 3A illustrate systems utilizing the device of FIG. 2.

FIG. 3 illustrates a system utilizing the device of FIG. 2. A source 26 for producing a current waveform that increases in magnitude with time, such as, for example, a current ramp, is coupled to the narrow end of the film 14 and a plurality of control terminals 28*a*, 28*b* and 28*c* are coupled to the tapered portions 24 of film 14.

Figure 3A:
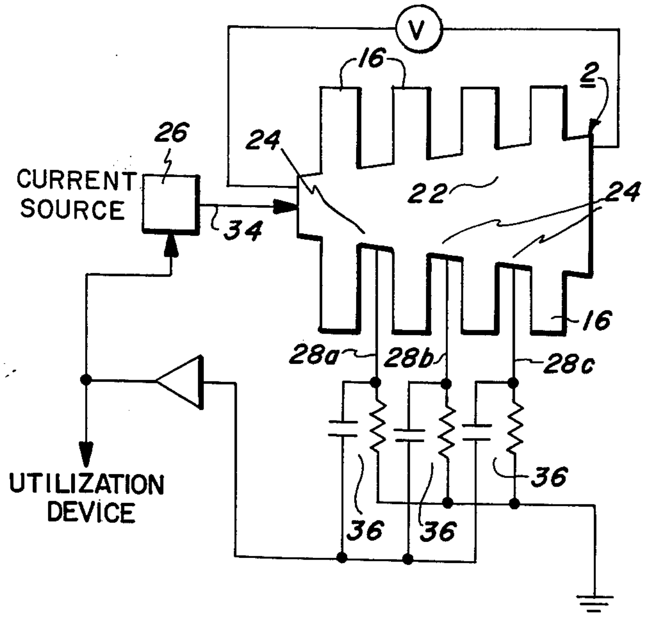

Each of the tapered portions 24 are connected through a load resistor 30 to a reference potential such as ground as shown. In operation, when the first portion 24 closest to source 26 of the tapered resistor has been heated by the current from source 26 to a temperature sufficient to cause the portion of layer 22 overlying it to switch to its low resistance state, the resistance value between the input and the first control terminal 28*a* decreases suddenly and a current pulse flows through the first control terminal to ground via its load resistor 30. A coil 32 in operative association with the control terminals detects the current pulse and generates a pulse which, after amplification, is utilized to gate off the source 26 and may also be utilized to gate into operation a utilization device, such as, for example, a copier which is designed to make one copy each time a current pulse is supplied thereto. Reactivation of the source 26 will cause the next tapered portion 24 of the film 14 to be heated to a temperature which causes a portion of layer 22 overlying it to switch to its low resistant state, once again causing the generation of a current pulse which gates the source 26 off and sends an additional pulse to the utilization device. Current pulse detection can be provided by other than coil 32, as, for example, by an RC networks 36 as shown in FIG. 3A.

Figure 4:
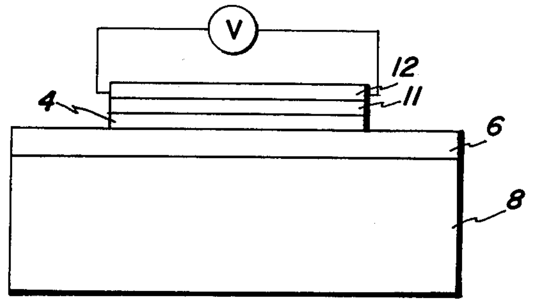
FIGS. 4 and 5 are side views of other forms of progressively shorted tapered resistance devices in accordance with the invention.

The layer of heat sensitive material need not be deposited directly on the tapered resistor film but may be separated therefrom, provided, however, that heat produced as the result of current flow through the tapered resistor film is conveyed to the heat sensitive material. Referring to FIG. 4, a thin layer 11 of electrical insulating material is interposed between tapered resistive film 4 and the layer 12 of heat sensitive material. Electrical connections (not shown) are provided to the opposite ends of both the film 4 and the layer 12. Application of sufficient bias to the film 4 will cause heat to be conveyed to the layer 12, resulting in localized changes in the resistance of layer 12. Measurement of the resistance of layer 12 provides an indication of the magnitude of the current flow through film 4.

Figure 5:
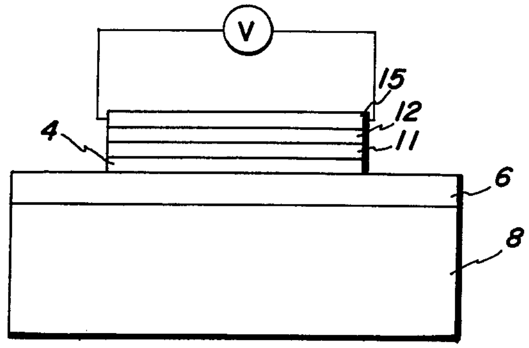

If it is not desirable to measure the resistance of layer 12 to provide an indication of current magnitude, an additional layer of electrical resistance material (which can be similar to the material of layer 4) can be deposited adjacent layer 12, as shown in FIG. 5 wherein layer 15 is an electrical resistance material. In the embodiment of FIG. 5, the heat produced by current flow through layer 4, causes localized decreases in the resistance of layer 12, thereby "shorting" portions of layer 15. An indication of the current flow through film 4 is provided by measuring the resistance change of layer 15.

The device of FIG. 2 can be utilized, for example, as a credit card in the system of FIG. 3. When so utilized the device of FIG. 2 would be inserted into a system which would connect the credit card electrically as shown in FIG. 3. After all portions of the device of FIG. 2 have been utilized to initiate activation of the utilization device, further pulses would not be sent to the utilization device and a new credit card would have to be inserted if further usage of the utilization device was desired.

We claim:

1. A tapered resistor device comprising:

a tapered, electrically resistive element which develops a non-uniform temperature profile on electrical energization, and a body of a material which undergoes an irreversible resistance change when heated above a threshold temperature, said body of material being in operative association with said tapered resistive element whereby heat produced by said tapered resistive element is operable to change the resistance of at least a portion of said body of material heated above said threshold temperature.

2. The device of claim 1 wherein said body of material undergoes an irreversible resistance decrease when heated above a threshold temperatue.

3. The device of claim 1 further including means for detecting any resistance change of said tapered resistive element.

4. The device of claim 1 wherein the taper of said resistive element is linear.

5. The device of claim 1 wherein said tapered resistive element has a stepped configuration.

6. The device of claim 1 wherein a layer of electrically insulating material is interposed between said tapered resistive element and said body of material, and means are provided for measuring any resistance change of said body of material.

7. The device of claim 1 wherein said tapered resistive element has tabs distributed along its length, and means for providing electrical contact to said tapered resistive element at at least some points between said tabs.

8. The device of claim 1 wherein said tapered resistive element is supported by an electrically insulating substrate.

9. The device of claim 1 wherein said body of material is a chalcogenide glass.

10. The device of claim 2 wherein said body of material is a chalcogenide glass.

11. The device of claim 1 wherein a layer of electrically insulating material is interposed between said tapered resistive element and said body of material, and a layer of electrically resistive material is deposited on said body of material.

12. A tapered resistor device comprising a tapered resistive element which develops a non-uniform temperature profile on electrical energization, a heat sensitive resistive material along the length of and in operative association with said tapered resistive element and responsive to heat above a given threshold temperature developed by said resistive element to undergo an irreversible resistance change thereby changing the overall resistance value of the device.

13. The device of claim 12, wherein said tapered resistive element and said heat sensitive resistive material are divided into a plurality of tapered segments and means to detect the resistance change of each segment.

14. The device of claim 13, wherein said tapered segments are defined by a plurality of tabs extending outwardly along at least one length of said tapered resistive element and said heat sensitive resistive material, said detection means connected to said resistive element at said tapered segments between said tabs.

15. The device of claim 12 wherein the resistance change of said heat sensitive resistive material is toward a conductive state and the amount of said change along its length is dependent upon the value of electrical energization applied to said tapered resistive element.

* * * * *